US006642700B2

(12) United States Patent
Slade et al.

(10) Patent No.: US 6,642,700 B2
(45) Date of Patent: Nov. 4, 2003

(54) SYSTEM, METHOD, FIELD UNIT, REFERENCE UNIT AND COMPUTER PROGRAM PRODUCT FOR PHASE TRACKING OF ELECTRICAL CONDUCTORS

(75) Inventors: Walter R. Slade, Arvada, CO (US); Scott James Frankenberg, Hudson, CO (US); Donald A. McCandless, Albuquerque, NM (US); Christopher W. Hickman, Los Lunas, NM (US)

(73) Assignee: Avistar, Inc., Albuquerque, NM (US)

( * ) Notice: Subject to any disclaimer, the term of this patent is extended or adjusted under 35 U.S.C. 154(b) by 0 days.

(21) Appl. No.: 10/105,326

(22) Filed: Mar. 26, 2002

(65) Prior Publication Data
US 2003/0184275 A1 Oct. 2, 2003

(51) Int. Cl.[7] .............................................. G01R 19/00
(52) U.S. Cl. .......................................... 324/66; 702/72
(58) Field of Search ..................... 324/66, 521, 103 R, 324/107, 142, 86, 76.52, 76.77, 67; 702/72, 73

(56) References Cited

U.S. PATENT DOCUMENTS

| 3,027,513 | A | 3/1962 | Mulavey et al. ......... 324/76.83 |
|---|---|---|---|
| 3,829,765 | A | 8/1974 | Siler ............................ 324/67 |
| 4,626,622 | A | 12/1986 | Bouvrette ................ 379/93.37 |
| 4,852,174 | A | 7/1989 | Bouchard ..................... 381/58 |
| 5,055,769 | A | 10/1991 | Gentile ........................ 324/86 |
| 5,072,403 | A | 12/1991 | Johns .......................... 702/59 |
| 5,467,011 | A | 11/1995 | Hunt ............................ 324/67 |
| 5,510,700 | A | 4/1996 | Pomatto ....................... 324/66 |
| 5,521,491 | A | 5/1996 | Najam ......................... 324/86 |
| 5,617,329 | A | 4/1997 | Allison et al. .............. 700/286 |
| 5,995,911 | A | 11/1999 | Hart ............................ 702/64 |
| 6,130,531 | A | 10/2000 | Hao ............................ 324/85 |

OTHER PUBLICATIONS

FC4000 Satellite Phasing Unit User's Guide, Radiodetection, pp. 3–17, Feb. 4, 2001.
Ndb Technologie inc. Archived Web Page, Feb. 1, 2001.
Waybackmachine Internet Archive, List of ndb Technologie inc. Archived Web Pages, Search Performed Jan. 14, 2003.
NDB website: Http://www.ndb.qc.ca/English/produits/fc4000.htm (pp. 1–3), Feb. 25, 2002.
Department of Energy WAMS Technology Evaluation and Demonstration, pp. 7–5 through 7–11 and 8–12 and 9–8, Jan. 27, 2001.
1993 IEEE International Frequency Control Symposium *Precise Timing in Electric Power Systems*, Kenneth E. Martin, Bonneville Power Administration, P.O. Box 491 m/s ELIP, Vancouver WA 98666, pp. 15–22.
IEEE Transactions on Power Delivery, *IEEE Standard for Synchrophasors fo rPower Systems*,K.E. Martin et al., Jan. 1998, vol. 13, No. 1, pp. 73–77.

Primary Examiner—John E. Chapman
Assistant Examiner—Kerveros James
(74) Attorney, Agent, or Firm—Oblon, Spivak, McClelland, Maier & Neustadt, P.C.

(57) ABSTRACT

System for tracking or identifying the phase designation, and/or measuring the phase angle or the power angle of electrical conductors at a remote location relative to a reference location, by measuring a time delay between an external clock source such as GPS and a zero crossing or other specified part of the waveform, associating a 'time tag' with each measurement, transmitting the time tags and measurement values over a bi-directional link between a field unit and a reference unit, and calculating and displaying a relative phase angle and/or a phase designation. The system finds application, for example, in identifying the phase of conductors, and optionally comparing their phase angle and/or their power angle, before making connections between conductors in a multi-phase electrical power distribution system.

47 Claims, 4 Drawing Sheets

SYSTEM, METHOD, FIELD UNIT, REFERENCE UNIT AND COMPUTER PROGRAM PRODUCT FOR PHASE TRACKING OF ELECTRICAL CONDUCTORS

BACKGROUND OF THE INVENTION

1. Field of the Invention

The present invention relates to the tracking of phase angle in electrical conductors at remote locations. This includes not only identification of the phase of conductors, but may also include measurement of the actual phase angle.

2. Discussion of the Background

Electricity transmission and distribution systems normally employ multiple phases, typically three phases. Correct identification of the conductors at any given point in the system is very important. For example, small loads such as residential users are typically divided between the phases, and ideally should be divided equally, i.e. the loads should be balanced. Therefore, it is important to be able to choose a particular phase when connecting new consumers. Further need for phase identification arises when two sources of electricity have to be connected together. This is necessary for closing loops in overhead and underground distribution and for connecting multiple distribution feeds to a power network. Inadvertent connection of sources belonging to different phases can cause catastrophic damage to equipment and is highly dangerous to operating personnel. Although key points in transmission and distribution systems may be tagged with phase designations, over time the daily operation of the system tends to render such phase markings invalid. For example, a neighborhood that was once connected to one phase of a distribution system may have at some time been changed over to a different phase. Equipment upgrades may also give rise to the need to connect/reconnect to particular conductors carrying a particular phase.

Various methods are known for tracking or tracing the phase of electrical conductors in transmission and distribution. Visual tracing of overhead conductors is possible, but is time consuming and is prone to error. Such a technique is, of course, not possible where conductors are routed underground. To directly identify an underground conductor, it may even be necessary to de-energize the conductor of interest.

Gentile (U.S. Pat. No. 5,055,769) teaches determining phase relationships by synchronizing with an internal counter. However, in this system a single unit has to be physically carried from a main panel to a remote panel within a fine minute time limit, which limits the application of Gentile's apparatus.

One known method of identifying the phase of conductors at a remote location is to send some form of a pilot signal on the conductor of interest. This is done, for example, in Allison et al (U.S. Pat. No. 5,617,329). In the system of Allison et al metering information from remote locations is transmitted in synchronism with a particular portion of the waveform, so that the phase of the load may be identified at a central location. No provision is made in Allison et al for this information to be sent back to the remote location.

Another known method is to send a sample of the waveform at a reference location to a remote field location for phase comparison at the field location. Systems of this type are shown in Mulavey et al (U.S. Pat. No. 3,027,523), Bouvrette (U.S. Pat. No. 4,626,622), Pometto (U.S. Pat. No. 5,510,700), and Hao (U.S. Pat. No. 6,130,531). Each of these systems has to be compensated for the time delay between the reference location and the remote field location.

Yet another approach to remote identification of the phase of conductors is used in Najam (U.S. Pat. No. 5,521,491). In the system of Najam the reference transmitter injects a data packet at each zero crossover, and a test receiver detects a received data packet and detects the local occurrence of zero crossover. However, the system of Najam does not appear to make any provision for propagation delay, as it is mainly aimed at use within a building. Also, the test apparatus includes only a receiver, and does not disclose any mechanism to initiate transmission of test signals from the reference transmitter, and therefore the reference transmitter must broadcast test signals on an essentially continuous basis.

Synchronized measurements of power waveforms making use of GPS and time tags have heretofore only been applied to fault location and/or the study of transient power disturbances (see Martin "Precise Timing in Electric Power Systems," 1993 IEEE International Frequency Control Symposium), and not to the uses described herein.

As power is delivered through an electrical transmission and distribution system, its power angle changes due to changes in the nature of the system, the generators attached, and the load attached. The power angle is the difference in phase angle between like voltage phases at two different points in the power system. Knowing the power angle of two different points in an electrical system tells an operator how power will flow once those points are connected together, and whether they can be connected safely. This information is useful for the operator of the electrical system, as catastrophic failure can occur should two points be connected where the power angles do not properly match. A need therefore also exists for comparison of power angle between different locations.

SUMMARY OF THE INVENTION

In one embodiment, the present invention employs a field unit and a reference unit both receiving a time signal from a common source, such as a satellite in the global positioning system (GPS), or a radio broadcast of a standard time signal, such as WWVB, and also provided with bi-directional wireless communication between the two units. As an alternative to a common time source, the field unit and reference unit may each be provided with an atomic clock, such as a Rubidium clock well known in the art, and the clocks may be synchronized to one another. It is of course possible for more than one field unit to be used with the same reference unit. The field unit is connected, either directly or via an external probe, to a conductor at a remote field location, and the reference unit is connected in a similar way to a reference conductor at a reference location.

In a common exemplary use, the field unit is connected to a conductor at a subscriber installation, while the reference unit is connected to a conductor at a substation. The field unit and the reference unit may in fact be connected anywhere in the distribution system, or anywhere in the high voltage transmission system with the aid of suitable probes.

In this embodiment, each of the reference unit and the field unit take readings of the phase of the main waveform at intervals determined by the time signal from the common source, and the field unit interrogates the reference unit by the bi-directional wireless link provided to obtain a comparison of the phase between the conductor at the field location and the conductor at the reference location. The result of this comparison is then displayed at the field unit.

The comparison of either phase angle or power angle need not be carried out in the reference unit, but may be carried out in the field unit. The comparative data may also be sent to equipment at a third location, such as a control center. This third location may be useful to independently verify and interpret the data presented on the field unit, so that a supervisor at the third location could help guide a field technician who is operating the field unit. It will also be appreciated that the bi-directional link between the field unit and the reference unit may not be a wireless link, but could be a fixed link, such as through the fixed telephone system or via the Internet.

In the above embodiments, measurements are taken simultaneously at the reference and field locations in synchronism with the time signal from the common source, and the measurement values are then associated with a 'time tag' so that measurements taken at each location can be compared for the same time period.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
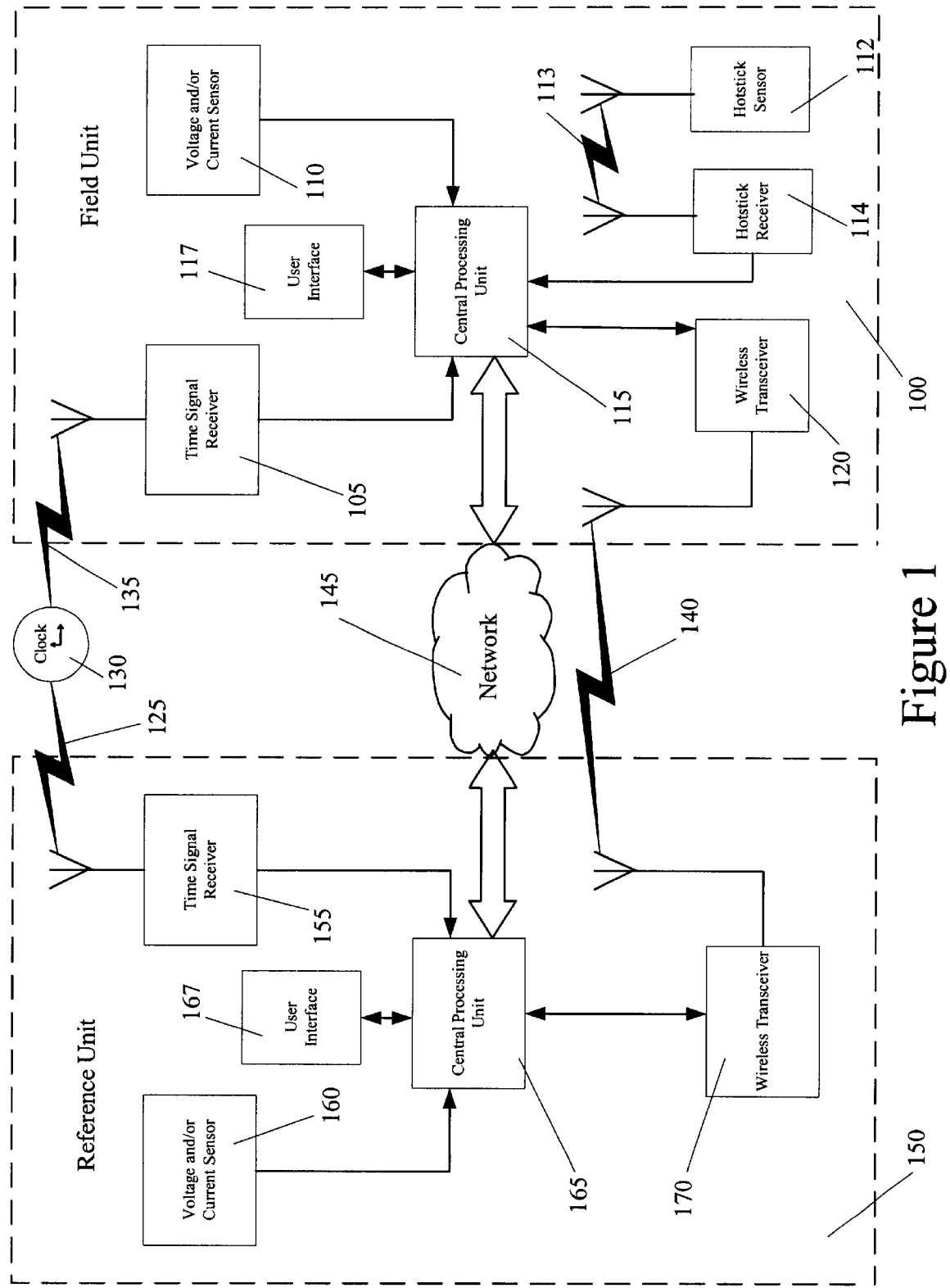
FIG. 1 is a block schematic of a system according to an embodiment of the invention.

Referring now to the drawings, wherein like reference numerals designate identical or corresponding parts throughout the several views, FIG. 1 shows an embodiment of the inventive phase tracking system which includes three main components: a field unit 100, a reference unit 150 and a clock 130. Clock 130 represents an external source of time signals, such as the Global Positioning System (GPS) or any similar earth-orbiting satellite navigational system such as GLONASS. Alternatively, clock 130 may be a terrestrial time source, such as the radio broadcasts from WWVB, or each unit may have a synchronized atomic clock, such as Rubidium clock. Field unit 100 includes a time signal receiver 105, a voltage sensor and/or a current sensor 110, a central processing unit 115, a user interface 117 and a wireless transceiver 120. In addition to or instead of sensor 110, a hotstick sensor 112 may be provided comprising a sensor on a long (e.g., 25–30 ft.) electrically insulating pole, connected by a radio link 113 to a hotstick receiver 114. The field unit may be arranged to sense the local voltage by either direct connection to a secondary voltage, using a hotstick for overhead lines, or by using a device to sense the voltage on an underground cable terminator or 'elbow'. Similarly, reference unit 150 includes a time signal receiver 155, a voltage sensor and/or current sensor shown at 160, a central processing unit 165, a user interface 167 and a wireless transceiver 170. Time signal receivers 105 and 155 in field unit 100 and reference unit 150, respectively, each receive clock signals from clock 130 via communication links 135 and 125, respectively. Bi-directional communication is also established between wireless transceivers 120 and 170 in the field unit 100 and reference unit 150, respectively, via the bi-directional communication link 140. Alternatively, a network 145, such as a telephone network (POTS) or the Internet may be employed.

Figure 2:
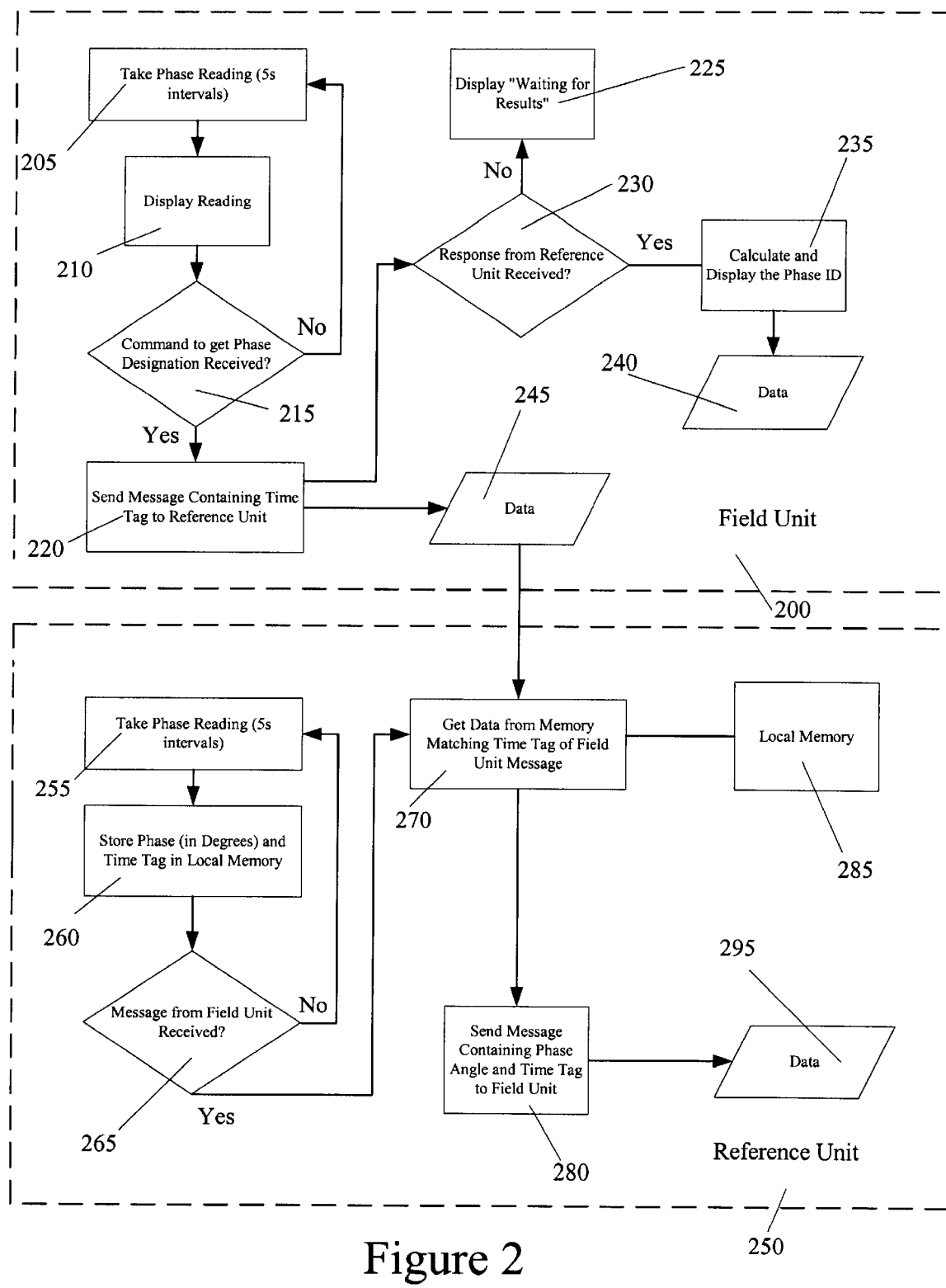
FIG. 2 is a flow chart of a method according to an embodiment of the invention.

A method of operation according to an embodiment of the invention will be better understood by reference to FIG. 2. In FIG. 2, those steps that take place in the field unit 100 are collected together in block 200, whereas those steps that take place in the reference unit 150 are collected together in block 250. In step 205 phase readings are taken on the field conductor at intervals of, say five seconds, or any other convenient interval such as any periodic or aperiodic time between 60 minutes and 1 ms. If too long of a time, there is a risk of inaccuracy in measurement due to some phase drift on the phase conductor due to load or supply changes. Furthermore, the technician taking the reading would have to wait too long to obtain a reading, which would become a particular problem if the technician were holding a long hotstick to reach an overhead conductor. If too short of a period, there is a risk of inaccuracy in phase measurement, since the power being measured has a period of $\frac{1}{60}$ seconds at 60 Hz. Intervals shorter than $\frac{1}{60}$ seconds would sample less than a complete cycle. The timing of these phase readings is determined with reference to the external time source, e.g., clock 130, typically GPS. In this way the phase readings taken on the field conductor may be synchronized with readings taken on the reference conductor in the reference unit. The phase readings taken are in the form of a time delay value relative to a specified portion of a voltage or current waveform, e.g., zero crossing. At step 210 the phase reading taken in the field unit is displayed.

At step 215 a decision is made as to whether a command has been received to get a phase designation, i.e., whether such a command has been entered by the user. If no command has been received, then steps 205 and 210 are repeated. If a command has been received to get a phase designation, then step 220 is executed, in which a message is sent to the reference unit containing the value of time delay determined in step 205, as well as a corresponding time tag representing the time at which the phase reading was taken in relation to the external time signal from clock 130. The phase reading may be expressed either as a phase angle in degrees or radians, or as a time delay per se. When step 220 is executed data containing the time tag is sent in step 245 to the reference unit and a decision is made in step 230 as to whether a response has been received from the reference unit. If no response has been received from the reference unit, then a display is given at step 225 to indicate that no response has been received. If a response has been received from the reference unit, then the phase identification is calculated and displayed in step 235 as data 240.

In the reference unit 150, in step 255, the reference unit takes phase readings on the reference conductor at intervals of five seconds, or at any other convenient interval. As in the field unit, these measurements in the reference unit are synchronized with the clock source 130. In step 260 the phase reading and the corresponding time tag, determined relative to clock 130, are stored in local memory. Then in step 265, a decision is made as to whether a message has been received from the field unit. If no message has been received from the field unit, then steps 255 and 260 are repeated. If a message has been received from the field unit, then the method proceeds to step 270. In step 270 the data 245 from the field unit is examined to determine the time tag and data is retrieved from local memory 285 representing the reference phase reading having the same time tag (within a predetermined tolerance ) as the received field phase reading. A tolerance of +/−400 microseconds is considered to be adequate for phase identification, whereas +/−50 microseconds is considered to be more appropriate for phase measurement per se. In step 280, data 295 is sent to the field unit 100 containing the phase angle and time tag retrieved from local memory 285. Further, the phase designation of the field conductor is determined by the field unit 100.

In an alternative embodiment, the field unit 100 sends a request to the reference unit 200 without sending a time tag value, and the reference unit 150 returns only the last recorded value of the reference phase angle. This could however, lead to errors, that would be avoided by sending the time tag.

In another alternative embodiment, the field unit 100 sends a request without a time tag, and the reference unit 150 responds by sending a series of consecutive phase angle values with their respective time tags. The field unit 100 then selects the value of reference phase angle having the correct time tag.

In yet another embodiment, the reference unit 150 sends reference phase indicators, containing reference phase values and their respective time tags, to an Internet server (not shown) for storage, and the field unit 100 interrogates the Internet server to select the value of reference phase angle having the correct time tag.

By this process it is possible both to derive the difference in phase angle between the reference conductor and the field conductor, and also, where there are multiple phases, it is possible to determine the phase identification of the field conductor, assuming a knowledge of which phase has been selected for the reference conductor. For example, in the commonly used three-phase system, if the phase difference between the reference conductor and the field conductor is less than 60 degrees, then both conductors are on the same phase. Similarly, if the field conductor leads the reference conductor by more than 60 degrees, but less than 180 degrees, then the field conductor is connected to that phase which leads the reference phase. Conversely, if the reference conductor has a phase angle that lags the reference conductor by more than 60 degrees but less than 180 degrees, then the field conductor is on the next phase lagging the reference phase. In other words, if there are three phases designated A, B and C, then if it is known which of these phases the reference conductor is on, then it is possible to determine which phase the field conductor is on.

Figure 3:
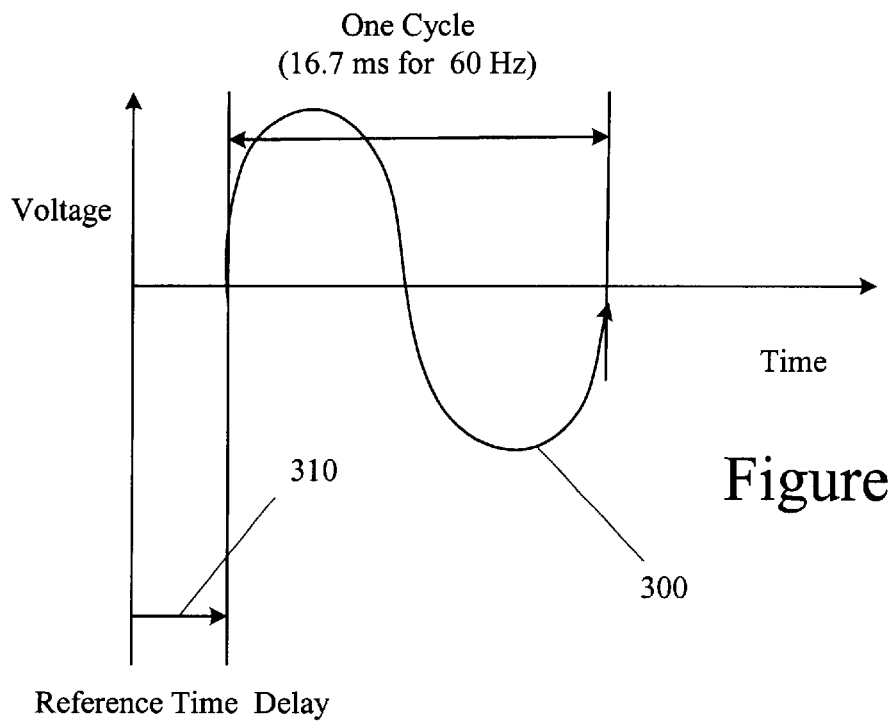
FIG. 3(a) is a diagram of a waveform at a reference unit according to an embodiment of the invention.
FIG. 3(b) is a diagram of a waveform at a field unit according to an embodiment of the invention.
Figure 3:
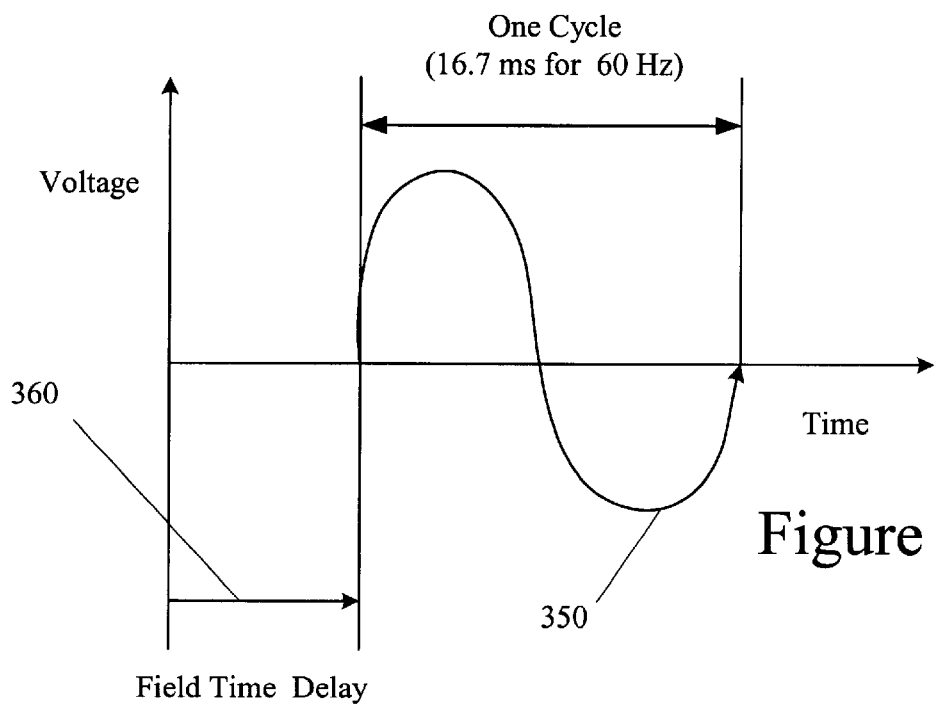

FIGS. 3(a) and 3(b) are waveforms illustrating the phase readings in the reference unit and field unit respectively. In each of these figures only a single cycle of a voltage waveform is shown for convenience. In FIG. 3(a) the reference voltage waveform is shown at 300 and reference time delay 310 represents a delay from a timing signal derived from clock 130 until the next occurring zero crossing of the voltage waveform 300. Similarly, in FIG. 3(b) a voltage waveform at the field unit is represented by waveform 350, and field time delay 360 represents a delay between the same time signal and the next occurring zero voltage crossing of the waveform 350. Instead of measuring from the timing signal to the next zero crossing, it would be possible to measure to the next waveform peak, but this would be less accurate since it is more difficult to detect a peak. Also, the same process can be carried out for the respective current waveforms, or for both the voltage and the current waveforms, and thus the measured time delays can easily be converted to phase angles in degrees, since the period of one cycle of the power waveform is known, i.e., 16.7 milliseconds (ms) for 60 Hz power in North America, 20 milliseconds (ms) for 50 Hz power in Europe, and generally one or the other of these for other parts of the world. Further, in at least one embodiment of the invention the period of the waveform is actually measured by the apparatus.

By comparing the reference phase angle with the field phase angle for synchronized measurements having corresponding time tags, in one embodiment of the invention, the field unit may display a relative phase angle, i.e., the phase angle of the field conductor relative to the reference conductor, either as well as or instead of displaying the phase designation of the field conductor and/or the relative phase angle of the field conductor.

It will of course be appreciated by one skilled in the art, that both the field unit and the reference unit may employ microcomputers or microprocessors with ROM (Read Only Memory) and RAM (Random Access Memory) and that the field units and reference unit may be controlled by way of suitable computer programs stored on suitable computer storage media. That is, the steps carried out in FIG. 2 may be performed by running a suitable computer program. The field units may be realized in a small self-contained unit having a display and suitable controls provided thereon. Suitable probes may be attached to the field units to enable them to measure the appropriate ranges of voltage and current associated with the field conductors to be tested. It will be appreciated by one skilled in the art that an existing unit such as a portable digital assistant (PDA) may be adapted by way of appropriate software and appropriate accessories to serve as a field unit.

In a similar way, the reference unit may be realized as a dedicated unit having suitable hardware and software, or may be realized in the form of a general-purpose computer, provided with a CPU, ROM, RAM and appropriate software. In the case of a general-purpose computer, a computer program controlling the reference unit may be stored on the computer's hard drive.

Figure 4:
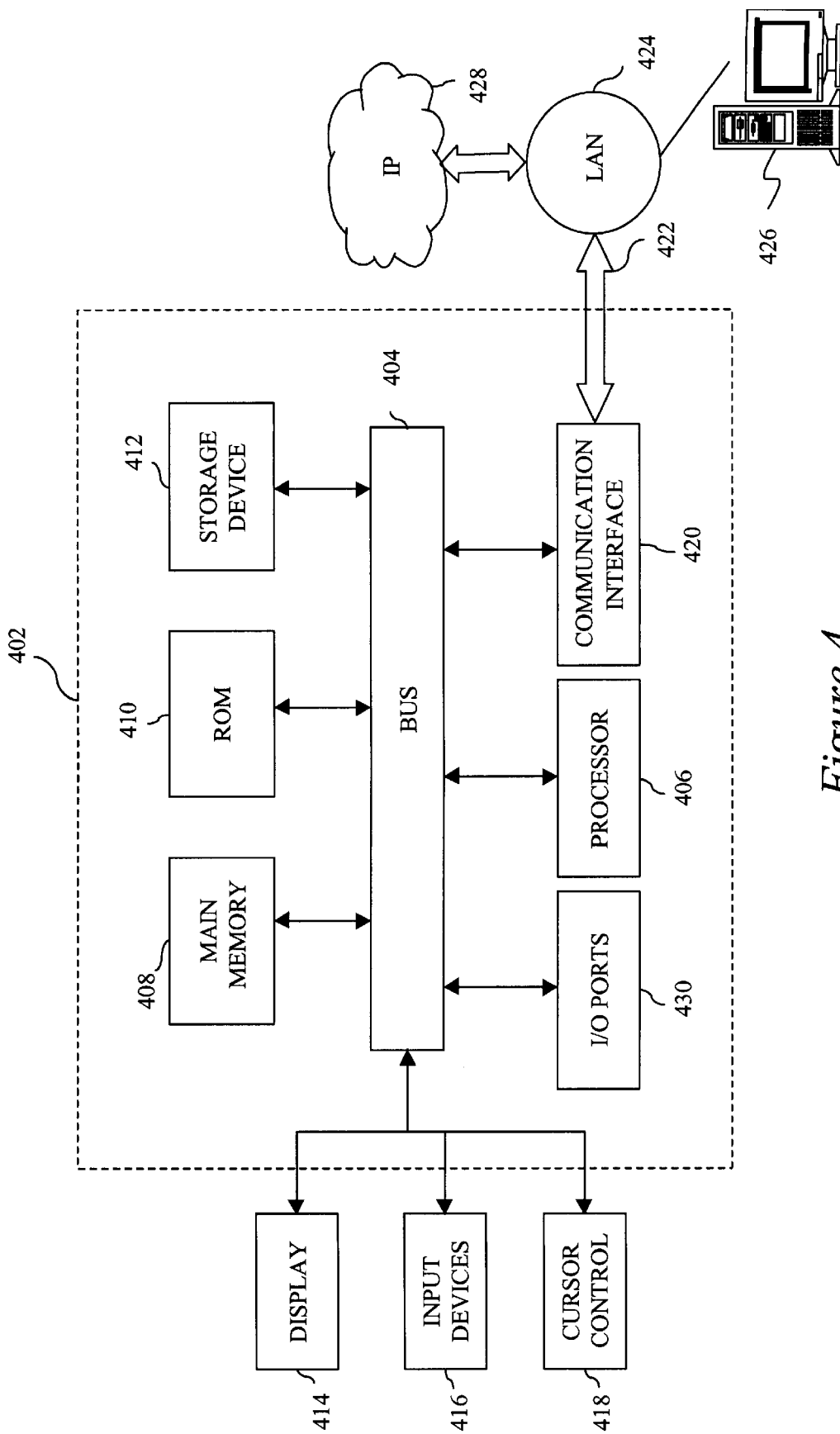
FIG. 4 is a block diagram of a central processing unit employed by the reference unit and/or the field unit.

FIG. 4 illustrates a computer system 402 upon which the present invention may be implemented. The computer system 402 may be any one of a personal computer system, a work station computer system, a lap top computer system, an embedded controller system, a microprocessor-based system, a digital signal processor-based system, a hand held device system, a personal digital assistant (PDA) system, a wireless system, a wireless networking system, etc. The computer system 402 includes a bus 404 or other communication mechanism for communicating information and a processor 406 coupled with bus 404 for processing the information. The computer system 402 also includes a main memory 408, such as a random access memory (RAM) or other dynamic storage device (e.g., dynamic RAM (DRAM), static RAM (SRAM), synchronous DRAM (SDRAM), flash RAM), coupled to bus 404 for storing information and instructions to be executed by processor 406. In addition, main memory 408 may be used for storing temporary variables or other intermediate information during execution of instructions to be executed by processor 406. The computer system 402 further includes a read only memory (ROM) 410 or other static storage device (e.g., programmable ROM (PROM), erasable PROM (EPROM), and electrically erasable PROM (EEPROM)) coupled to bus 404 for storing static information and instructions for processor 406. A storage device 412, such as a magnetic disk or optical disk, is provided and coupled to bus 404 for storing information and instructions.

The computer system 402 may also include special purpose logic devices (e.g., application specific integrated circuits (ASICs)) or configurable logic devices (e.g., generic array of logic (GAL) or re-programmable field programmable gate arrays (FPGAs)). Other removable media devices (e.g., a compact disc, a tape, and a removable magneto-optical media) or fixed, high-density media drives, may be added to the computer system 402 using an appropriate device bus (e.g., a small computer system interface (SCSI) bus, an enhanced integrated device electronics (IDE) bus, or an ultra-direct memory access (DMA) bus). The computer system 402 may additionally include a compact disc reader, a compact disc readerwriter unit, or a compact disc jukebox, each of which may be connected to the same device bus or another device bus.

The computer system 402 may be coupled via bus 404 to a display 414, such as a cathode ray tube (CRT), liquid crystal display (LCD), voice synthesis hardware and/or software, etc., for displaying and/or providing information to a computer user. The display 414 may be controlled by a display or graphics card. The computer system includes input devices, such as a keyboard 416 and a cursor control 418, for communicating information and command selections to processor 406. Such command selections can be implemented via voice recognition hardware and/or software functioning as the input devices 416. The cursor control 418, for example, is a mouse, a trackball, cursor direction keys, touch screen display, optical character recognition hardware and/or software, etc., for communicating direction information and command selections to processor 406 and for controlling cursor movement on the display 414. In addition, a printer (not shown) may provide printed listings of the data structures, information, etc., or any other data stored and/or generated by the computer system 402.

The computer system 402 performs a portion or all of the processing steps of the invention in response to processor 406 executing one or more sequences of one or more instructions contained in a memory, such as the main memory 408. Such instructions may be read into the main memory 408 from another computer readable medium, such as storage device 412. One or more processors in a multi-processing arrangement may also be employed to execute the sequences of instructions contained in main memory 408. In alternative embodiments, hard-wired circuitry may be used in place of or in combination with software instructions. Thus, embodiments are not limited to any specific combination of hardware circuitry and software.

As stated above, the system 402 includes at least one computer readable medium or memory programmed according to the teachings of the invention and for containing data structures, tables, records, or other data described herein. Examples of computer readable media are compact discs, hard disks, floppy disks, tape, magneto-optical disks, PROMs (EPROM, EEPROM, Flash EPROM), DRAM, SRAM, SDRAM, etc. Stored on any one or on a combination of computer readable media, the present invention includes software for controlling the computer system 402, for driving a device or devices for implementing the invention, and for enabling the computer system 402 to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpreted or executable code mechanism, including but not limited to scripts, interpreters, dynamic link libraries, Java classes, and complete executable programs. Moreover, parts of the processing of the present invention may be distributed for better performance, reliability, and/or cost.

The term "computer readable medium" as used herein refers to any medium that participates in providing instructions to processor 406 for execution. A computer readable medium may take many forms, including but not limited to, non-volatile media, volatile media, and transmission media. Non-volatile media includes, for example, optical, magnetic disks, and magneto-optical disks, such as storage device 412. Volatile media includes dynamic memory, such as main memory 408. Transmission media includes coaxial cables, copper wire and fiber optics, including the wires that comprise bus 404. Transmission media also may also take the form of acoustic or light waves, such as those generated during radio wave and infrared data communications.

Common forms of computer readable media include, for example, hard disks, floppy disks, tape, magneto-optical disks, PROMs (EPROM, EEPROM, Flash EPROM), DRAM, SRAM, SDRAM, or any other magnetic medium, compact disks (e.g., CD-ROM), or any other optical medium, punch cards, paper tape, or other physical medium with patterns of holes, a carrier wave (described below), or any other medium from which a computer can read.

Various forms of computer readable media may be involved in carrying out one or more sequences of one or more instructions to processor 406 for execution. For example, the instructions may initially be carried on a magnetic disk of a remote computer. The remote computer can load the instructions for implementing all or a portion of the present invention remotely into a dynamic memory and send the instructions over a telephone line using a modem. A modem local to computer system 402 may receive the data on the telephone line and use an infrared transmitter to convert the data to an infrared signal. An infrared detector coupled to bus 404 can receive the data carried in the infrared signal and place the data on bus 404. The bus 404 carries the data to main memory 408, from which processor 406 retrieves and executes the instructions. The instructions received by main memory 408 may optionally be stored on storage device 412 either before or after execution by processor 406.

The computer system 402 also includes a communication interface 420 coupled to bus 404. The communication interface 420 provides a two-way data communication coupling to a network link 422 that may be connected to, for example, a local network 424. For example, the communication interface 420 may be a network interface card to attach to any packet switched local area network (LAN). As another example, the communication interface 420 may be an asymmetrical digital subscriber line (ADSL) card, an integrated services digital network (ISDN) card or a modem to provide a data communication connection to a corresponding type of telephone line. Wireless links may also be implemented via the communication interface 420. In any such implementation, the communication interface 420 sends and receives electrical, electromagnetic or optical signals that carry digital data streams representing various types of information. Network link 422 typically provides data communication through one or more networks to other data devices. For example, the network link 422 may provide a connection to a computer 426 through local network 424 (e.g., a LAN) or through equipment operated by a service provider, which provides communication services through a communications network 428. In preferred embodiments, the local network 424 and the communications network 428 preferably use electrical, electromagnetic, or optical signals that carry digital data streams. The signals through the various networks and the signals on the network link 422 and through the communication interface 420, which carry the digital data to and from the computer system 402, are exemplary forms of carrier waves transporting the information. The computer system 402 can transmit notifications and receive data, including program code, through the network(s), the network link 422 and the communication interface 420.

Further applications of the present invention are also envisaged, as follows:

An area of concern with distributed generators is how to reliably detect an islanded condition of the distributed generator at the generation site. Islanding of a generator occurs when the generator is disconnected from the electrical system due to the opening of protective devices (breakers, fuses, switches, etc.) elsewhere in the electrical system. Should this condition go undetected by the distributed generator, the generator will continue to feed power into the remaining system to which it is connected, possibly creating a hazardous situation for operating personnel attempting to remedy the situation.

Present methods used to determine islanded conditions include determining all possibilities for an islanded condition and then monitoring key locations for openings in the power system, or monitoring the power factor at the point of connection for the distributed generator. Such methods are not fully reliable, as an islanding situation may occur that does not create the necessary warnings to trip the detection method. An islanded generator should be tripped within two seconds to comply with proposed IEEE standard 1547.

In this situation, the phase tracking device would continuously monitor the voltage phase angle with respect to a reference phase. Should the generator enter into an islanded condition, almost immediately its phase angle would drift appreciably from the system phase angle. In theory, some drifting of phase would always occur, regardless of the conditions creating the islanded state.

During the design and construction phases of the substation installations, the phasing of the incoming and outgoing circuits affects the physical placement of equipment and the physical arrangement of connections on such equipment. Determining such phasing at present is often done through visual inspections of lines feeding the substation, and final equipment connections (particularly with delta-wye transformers) often degrade to a "trial and error" procedure.

The phase tracking device would remove doubt about the phasing of incoming lines during the design of the substation, and remove the "trial and error" nature of final connection of the substation equipment.

A common problem with utility and privately owned power systems is a condition known as Stray Voltage. This condition is caused by a bad connection in the neutral portion of a circuit, which induces subtle differences in ground potentials of nearby equipment. Although this difference in ground potential is usually (1 to 5 volts) not significant enough to cause discomfort in humans, dairy cattle have been found to be extremely sensitive to such conditions. The source of the problem (a bad neutral connection) is often hard to find, and so creates a strain on the relationship between the dairy farmer and the supplying utility.

When stray voltage occurs, the current phase angles on both sides of the bad neutral connection are 180 degrees out of phase with respect to each other. The location of the bad neutral connection could be found using the phase tracking device through a systematic sampling of the neutral current phase angle at strategic points in the power system.

Commercial applications of the phase tracker are similar in nature to those for a utility system. Typical applications in the commercial sector include phase identification on commercial feeders, phase matching for connecting of motors and transformers to a commercial system and stray voltage troubleshooting on commercial systems.

Another application of the invention would be determining phase rotation in motors, which in turn controls the direction of actual rotation. The phase identification device described herein could be used to determine the electrical rotation of a three-phase source before it is connected to a motor. This information could then be used to ensure the correct physical rotation once the source is connected to the motor.

Obviously, numerous modifications and variations of the present invention are possible in light of the above teachings. It is therefore to be understood that within the scope of the appended claims, the invention may be practiced otherwise than as specifically described herein.

What is claimed is:

1. A phase tracking system for measuring relative phase angles between electrical conductors, comprising:

a reference unit configured to measure a reference time delay between a time signal and a predetermined portion of a waveform of a reference signal associated with a reference conductor at a reference location; and a field unit configured to measure a field time delay between said time signal and a predetermined portion of a waveform of a field signal associated with a field conductor at a field location;

wherein at least one of said units is configured to make a comparison between a reference time delay indicator representing said reference time delay and a field time delay indicator representing said field time delay, so as to determine a relative phase angle value of said field conductor in relation to said reference conductor; and said relative phase value comprises a phase designation of said field conductor at said field location, said field conductor being one of a plurality of conductors of a multi-phase electricity supply.

2. The phase tracking system according to claim 1, wherein:

said field unit is configured to transmit at least a field time tag to said reference unit, said field time tag representing a time at which said field time delay was measured;

said reference unit is configured to transmit at least said reference time delay to said field unit; and said field unit is configured to calculate and display said relative phase value.

3. The phase tracking system of claim 2, wherein:

said field time delay indicator comprises a field phase angle and said field time tag;

said reference time delay indicator comprises a reference phase angle and a reference time tag, said reference time tag representing a time at which said reference phase angle was measured; and said at least one of said units is configured to compare values of said reference phase angle and said field phase angle to determine if said reference time tag is equal in value within a predetermined tolerance to said field time tag.

4. The phase tracking system of claim 3, wherein:
a bi-directional communications link is provided between said reference unit and said field unit and carries said relative phase value to said field unit.

5. The phase tracking system of claim 4, wherein:
said time signal is derived from an external source from a satellite system.

6. The phase tracking system of claim 4, wherein:
said time signal is derived from an external source from a terrestrial radio broadcast.

7. The phase tracking system of claim 4, wherein:
said time signal is derived from an atomic clock in each said unit, and
a first atomic clock in said field unit is synchronized with a second atomic clock in said reference unit.

8. The phase tracking system of claim 1, wherein:
said field conductor is electrically a same phase as said reference conductor.

9. A method of measuring relative phase angles between electrical conductors, comprising steps of:
measuring a reference time delay between a time signal and a predetermined portion of a waveform of a reference signal associated with a reference conductor at a reference location;
measuring a field time delay between said time signal and a predetermined portion of a waveform of a field signal associated with a field conductor at a field location; and
comparing a reference time delay indicator representing said reference time delay and a field time delay indicator representing said field time delay and determining a relative phase angle value of said field conductor in relation to said reference conductor; and
said relative phase angle value comprises a phase designation of said field conductor at said field location, said field conductor being one of a plurality of conductors of a multi-phase electricity supply.

10. The method according to claim 9, further comprising the steps of:
transmitting at least a field time tag from said field unit to said reference unit, said field time tag representing a time at which said field time delay was measured;
transmitting at least said reference time delay from said reference unit to said field unit; and
calculating and displaying said relative phase value at said field unit.

11. The method of claim 10, wherein:
said field time delay indicator comprises a field phase angle and said field time tag;
said reference time delay indicator comprises a reference phase angle and a reference time tag, said reference time tag representing a time at which said reference phase angle was measured; and
said step of comparing further comprises comparing said reference phase angle and said field phase angle for values thereof where said reference time tag is equal in value within a predetermined tolerance to said field time tag.

12. The method of claim 11, further comprising a step of:
performing bi-directional communications between said reference location and said field location.

13. The method of claim 12, wherein:
said time signal is derived from an external source from a satellite system.

14. The method of claim 12, wherein:
said time signal is derived from an external source from a terrestrial radio broadcast.

15. The method of claim 12, wherein:
said time signal is derived from an atomic clock in each said unit, and
a first atomic clock in said field unit is synchronized with a second atomic clock in said reference unit.

16. The method of claim 9, wherein:
said field conductor is electrically a same phase as said reference conductor.

17. A phase tracking system for measuring relative phase angles between electrical conductors, comprising:
means for measuring a reference time delay between a time signal and a predetermined portion of a waveform of a reference signal associated with a reference conductor at a reference location;
means for measuring a field time delay between said time signal and a predetermined portion of a waveform of a field signal associated with a field conductor at a field location; and
means for comparing a reference time delay indicator representing said reference time delay and a field time delay indicator representing said field time delay, so as to determine a relative phase angle value of said field conductor in relation to said reference conductor; wherein
said relative phase value comprises a phase designation of said field conductor at said field location, said field conductor being one of a plurality of conductors of a multi-phase electricity supply.

18. The phase tracking system according to claim 17, further comprising:
means for transmitting at least a field time tag from said field unit to said reference unit, said field time tag representing a time at which said field time delay was measured;
means for transmitting at least said reference time delay from said reference unit to said field unit; and
means for calculating and displaying said relative phase value.

19. The phase tracking system of claim 18, wherein:
said field time delay indicator comprises a field phase angle and said field time tag;
said reference time delay indicator comprises a reference phase angle and a reference time tag, said reference time tag representing a time at which said reference phase angle was measured; and
said means for comparing said field time delay signal and said reference time delay signal further comprising means for comparing said reference phase angle and said field phase angle for values thereof where said reference time tag is equal in value within a predetermined tolerance to said field time tag.

20. The phase tracking system of claim 19, further comprising:
means for performing bi-directional communications between said reference location and said field location.

21. The phase tracking system of claim 20, wherein:
said time signal is derived from an external source from a satellite system.

22. The phase tracking system of claim 20, wherein:
said time signal is derived from an external source from a terrestrial radio broadcast.

23. The phase tracking system of claim 20, wherein:
said time signal is derived from an atomic clock in each said unit, and
a first atomic clock in said field unit is synchronized with a second atomic clock in said reference unit.

24. The phase tracking system of claim 17, wherein:
said field conductor is electrically a same phase as said reference conductor.

25. A field unit for a phase tracking system, comprising:
means for measuring a field time delay between a time signal and a predetermined portion of a waveform of a field signal associated with a field conductor at a field location;
means for transmitting from said field unit to a reference unit at least a field time tag representing a time at which said field time delay was measured;
means for receiving at least a reference time delay from said reference unit;
means for comparing said reference time delay and said field time delay, to determine a relative phase angle of said field conductor in relation to said reference conductor; and
means for displaying said relative phase angle; wherein said relative phase angle comprises a phase designation of said field conductor at said field location, said field conductor being one of a plurality of conductors of a multi-phase electricity supply.

26. The field unit of claim 25, wherein:
said reference time delay is measured at a time corresponding to said time represented by said field time tag, to within a predetermined tolerance.

27. The field unit of claim 26, wherein:
said field time delay is measured at intervals determined by said time signal.

28. The field unit of claim 27, further comprising:
means for performing bi-directional communications between said reference location and said field location.

29. The field unit of claim 28, wherein:
said time signal is derived from an external source from a satellite system.

30. The field unit of claim 28, wherein:
said time signal is derived from an external source from a terrestrial radio broadcast.

31. The field unit of claim 28, wherein:
said time signal is derived from an atomic clock in each said unit, and
a first atomic clock in said field unit is synchronized with a second atomic clock in said reference unit.

32. The field unit of claim 25, wherein:
said field conductor is electrically a same phase as said reference conductor.

33. A reference unit for a phase tracking system, comprising:
means for measuring a reference time delay between a time signal and a predetermined portion of a waveform of a reference signal associated with a reference conductor at a reference location;
means for receiving from a field unit a field time tag representing a time of measurement of a field time delay between said time signal and a predetermined portion of a waveform of a field signal associated with a field conductor at a field location; and
means for transmitting to said field unit at least a reference time delay representing a reference time delay between said time signal and a predetermined portion of a waveform of a reference signal associated with a reference conductor at a reference location.

34. The reference unit of claim 33, wherein:
said reference time delay is measured at a time corresponding to a reference time tag, said reference time tag representing a time at which said reference phase angle was measured, and said reference time tag is equal to said field time tag, to within a predetermined tolerance.

35. The reference unit of claim 34, further comprising:
means for performing bi-directional communications between said reference location and said field location.

36. The reference unit of claim 35, wherein:
said time signal is derived from an external source from a satellite system.

37. The reference unit of claim 35, wherein:
said time signal is derived from an external source from a terrestrial radio broadcast.

38. The reference unit of claim 35, wherein:
said time signal is derived from an atomic clock in each said unit, and
a first atomic clock in said field unit is synchronized with a second atomic clock in said reference unit.

39. The reference unit of claim 33, wherein:
said field conductor is electrically a same phase as said reference conductor.

40. A computer program product comprising a computer storage medium having a computer program code mechanism embedded in the computer storage medium for measuring relative phase angles between electrical conductors, the computer program code mechanism performing the steps of:
measuring a reference time delay between a time signal and a predetermined portion of a waveform of a reference signal associated with a reference conductor at a reference location; and
measuring a field time delay between said time signal and a predetermined portion of a waveform of a field signal associated with a field conductor at a field location;
comparing a reference time delay indicator representing said reference time delay and a field time delay indicator representing said field time delay, to determine a relative phase angle value of said field conductor in relation to said reference conductor; wherein
said relative phase angle value comprises a phase designation of said field conductor at said field location, said field conductor being one of a plurality of conductors of a multi-phase electricity supply.

41. The computer program product according to claim 40, wherein the computer program code mechanism further performs the steps of:
transmitting at least a field time tag from said field unit to said reference unit, said field time tag representing a time at which said field phase angle was measured;
transmitting at least said reference time delay from said reference unit to said field unit; and
calculating and displaying said relative phase angle value at said field unit.

42. The computer program product of claim 41, wherein:
said field time delay indicator comprises a field phase angle and said field time tag;
said reference time delay indicator comprises a reference phase angle and a reference time tag, said reference time tag representing a time at which said reference phase angle was measured; and said step of comparing further comprises comparing said reference phase angle and said field phase angle to determine if said reference time tag is equal in value within a predetermined tolerance to said field time tag.

43. The computer program product of claim 42, wherein the computer program code mechanism further performs the step of:

performing bi-directional communications between said reference location and said field location.

44. The computer program product of claim 43, wherein: said time signal is derived from an external source from a satellite system.

45. The computer program product of claim 43, wherein: said time signal is derived from an external source from a terrestrial radio broadcast.

46. The computer program product of claim 43, wherein: said time signal is derived from an atomic clock in each said unit, and a first atomic clock in said field unit is synchronized with a second atomic clock in said reference unit.

47. The computer program product of claim 40, wherein: said field conductor is electrically a same phase as said reference conductor.

* * * * *